US009531323B1

(12) United States Patent
Khalili et al.

(10) Patent No.: US 9,531,323 B1
(45) Date of Patent: Dec. 27, 2016

(54) LOW-POWER BALANCED CRYSTAL OSCILLATOR

(71) Applicant: QUALCOMM Incorporated, San Diego, CA (US)

(72) Inventors: Alireza Khalili, Sunnyvale, CA (US); Yashar Rajavi, Mountain View, CA (US); Mazhareddin Taghivand, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/748,946

(22) Filed: Jun. 24, 2015

(51) Int. Cl.
*H03B 5/32* (2006.01)
*H03B 5/36* (2006.01)

(52) U.S. Cl.
CPC .................... *H03B 5/364* (2013.01)

(58) Field of Classification Search
CPC ............... H03B 5/30; H03B 5/32; H03B 5/36; H03B 5/364
USPC ............. 331/116 FE, 116 M, 116 R, 117 FE, 117 R, 331/154, 158
See application file for complete search history.

(56) References Cited

U.S. PATENT DOCUMENTS

| 4,141,209 | A | 2/1979 | Barnett et al. |
| 6,437,652 | B1 * | 8/2002 | Gomez ............... H03B 5/364 331/105 |
| 6,542,042 | B1 | 4/2003 | Atkinson |
| 6,696,898 | B1 | 2/2004 | Ward et al. |
| 6,798,304 | B2 | 9/2004 | Gomez |
| 6,867,658 | B1 * | 3/2005 | Sibrai ............... H03B 5/1215 331/117 FE |
| 7,061,339 | B2 | 6/2006 | Sibrai et al. |

(Continued)

FOREIGN PATENT DOCUMENTS

| EP | 1220440 A2 | 7/2002 |
| EP | 1265352 A1 | 12/2002 |

(Continued)

OTHER PUBLICATIONS

Mazzanti A., et al., "Class-C Harmonic CMOS VCOs, With a General Result on Phase Noise," IEEE Journal of Solid-State Circuits, Dec. 2008, vol. 43 (12), pp. 2716-2729.

(Continued)

*Primary Examiner* — Levi Gannon
(74) *Attorney, Agent, or Firm* — Procopio, Cory, Hargreaves & Savitch LLP

(57) ABSTRACT

A circuit includes: first and second output terminals; a reference resonator coupled between the first and second output terminals; a cross-coupled oscillation unit coupled to the first and second output terminals; a first MOSFET diode coupled to the cross-coupled oscillation unit, the first MOSFET diode including a first transistor, a first resistor coupled between gate and drain terminals of the first transistor, and a first capacitor; a second MOSFET diode coupled to the cross-coupled oscillation unit, the second MOSFET diode including a second transistor, a second resistor coupled between gate and drain terminals of the second transistor, and a second capacitor cross coupled between the drain terminal of the second transistor and the gate terminal of the first transistor, wherein the first capacitor is cross coupled between the drain terminal of the first transistor and the gate terminal of the second transistor.

21 Claims, 9 Drawing Sheets

(56) References Cited

U.S. PATENT DOCUMENTS

| | | | |
|---|---|---|---|
| 7,342,464 B2 * | 3/2008 | Hino | H03C 3/227 331/108 C |
| 7,365,610 B2 * | 4/2008 | Zhang | H03B 5/04 331/105 |
| 7,391,278 B2 | 6/2008 | Berens | |
| 7,545,230 B2 * | 6/2009 | Jang | H03B 5/1228 331/117 FE |
| 7,733,190 B2 * | 6/2010 | Yajima | H03B 5/326 331/107 A |
| 7,768,359 B2 | 8/2010 | Chang et al. | |
| 7,821,349 B2 * | 10/2010 | Park | H03F 1/223 330/302 |
| 8,089,323 B2 * | 1/2012 | Tarng | H03B 5/04 330/127 |
| 8,232,845 B2 * | 7/2012 | Ruby | H03H 9/0538 257/416 |
| 8,576,017 B2 * | 11/2013 | Czimmek | H05B 6/04 219/205 |
| 8,736,392 B2 | 5/2014 | Taghivand | |
| 8,766,735 B2 * | 7/2014 | Sun | H03B 5/1212 331/115 |
| 8,866,557 B2 | 10/2014 | Lee et al. | |
| 2006/0049884 A1 * | 3/2006 | Kollmann | H03B 5/36 331/158 |
| 2007/0262825 A1 | 11/2007 | Kitamura et al. | |
| 2008/0238561 A1 | 10/2008 | Otsuka et al. | |
| 2009/0289732 A1 * | 11/2009 | Miyashita | H03B 5/1225 331/117 FE |
| 2011/0074513 A1 | 3/2011 | Bao | |
| 2014/0043106 A1 | 2/2014 | Samala | |
| 2016/0028349 A1 | 1/2016 | Rajavi et al. | |

FOREIGN PATENT DOCUMENTS

| | | |
|---|---|---|
| EP | 1496609 A1 | 1/2005 |
| WO | 03007469 A1 | 1/2003 |

OTHER PUBLICATIONS

Ruffieux D., "A High-Stability, Ultra-Low-Power Differential Oscillator Circuit for Demanding Radio Applications," Proceedings of the 28th European Solid-State Circuits Conference, 2002, pp. 85-88.

International Search Report and Written Opinion—PCT/US2016/033954—ISA/EPO—Sep. 7, 2016.

Yuyu Chang; Leete, J.; Zhimin Zhou; Vadipour, M.; Yin-Ting Chang; Darabi, H., "A Differential Digitally Controlled Crystal Oscillator With a 14-Bit Tuning Resolution and Sine Wave Outputs for Cellular Applications," Solid-State Circuits, IEEE Journal of, vol. 47, No. 2, pp. 421, 434, Feb. 2012.

* cited by examiner

LOW-POWER BALANCED CRYSTAL OSCILLATOR

BACKGROUND

Field

This disclosure relates generally to crystal oscillators, and more specifically, to a crystal oscillator configured with a cross-coupled oscillation unit including diode loads having transistors, resistors, and a cross-coupled capacitors.

Background

A crystal oscillator (XO) circuit is a critical component of a radio frequency (RF) system and is used for reference frequency generation in transceivers. For these transceivers, responses to a frequency different from that to which the transceivers are tuned (spurious responses) are one of the challenging issues. The XO harmonics can easily couple to other RF circuits through multiple paths and appear at receiver and transmitter outputs. Compared to a single-ended structure, a differential XO circuit is desirable due to better immunities to interference and spurious responses.

Conventional differential XO circuit designs have used a negative conductance (−Gm) of a modified cross-coupled pair of transistors as an active device and have added high-pass filtering to avoid latching at low frequencies. For example, FIG. 1 is a schematic diagram of a conventional differential XO circuit 100. In FIG. 1, the differential oscillation is achieved using a cross-coupled pair of metal-oxide semiconductor field-effect transistors (MOSFETs) 120, 122 and a resonator 110. A supply voltage (VDD) couples to the drain terminals of the cross-coupled MOSFETs 120, 122 through resistor loads 140, 142. Two alternating current (AC) coupling capacitors 130, 132 are added to provide high-pass filtering and, therefore, close-to-zero DC gain. However, the lack of a low-impedance DC path in the XO circuit causes the circuit 100 to latch up rather than provide oscillation under certain conditions.

SUMMARY

The present disclosure describes various implementations of a differential XO circuit are disclosed herein.

In one embodiment, a circuit is disclosed. The circuit includes: first and second output terminals; a reference resonator coupled between the first and second output terminals; a cross-coupled oscillation unit coupled to the first and second output terminals; a first metal-oxide semiconductor field-effect transistor (MOSFET) diode coupled to the cross-coupled oscillation unit, the first MOSFET diode including a first transistor, a first resistor coupled between gate and drain terminals of the first transistor, and a first capacitor; a second MOSFET diode coupled to the cross-coupled oscillation unit, the second MOSFET diode including a second transistor, a second resistor coupled between gate and drain terminals of the second transistor, and a second capacitor cross coupled between the drain terminal of the second transistor and the gate terminal of the first transistor, wherein the first capacitor is cross coupled between the drain terminal of the first transistor and the gate terminal of the second transistor.

In another embodiment, a method of generating an oscillation frequency at output terminals of a differential oscillator circuit is disclosed. The method includes: generating the oscillation frequency using a cross-coupled oscillation unit including a reference resonator coupled between the output terminals; providing a low-impedance load at low frequencies and a high-impedance load at higher frequencies by coupling first and second MOSFET diodes including first and second transistors to the cross-coupled oscillation unit, wherein each of the first and second MOSFET diodes also includes a resistor and a cross-coupled capacitor.

In yet another embodiment, an apparatus for generating an oscillation frequency at output terminals of a differential oscillator circuit is disclosed. The apparatus includes: means for generating the oscillation frequency using a cross-coupled oscillation unit including a reference resonator coupled between the output terminals; means for providing a low-impedance load at low frequencies and a high-impedance load at higher frequencies by coupling first and second MOSFET diodes including first and second transistors to the cross-coupled oscillation unit, wherein each of the first and second MOSFET diodes also includes a resistor and a cross-coupled capacitor.

In a further embodiment, a device is disclosed. The device includes: first and second output terminals; a cross-coupled oscillation unit configured to start and sustain oscillation at an oscillation frequency, the cross-coupled oscillation unit being coupled to the first and second output terminals; first and second diode loads configure to provide a low-impedance load at low frequencies and a high-impedance load at higher frequencies to the cross-coupled oscillation unit, each of the first and second diode loads configured to provide negative resistance at the oscillation frequency; and a reference resonator coupled between the first and second output terminals.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

To address the latch up problem stated above, several different embodiments of a differential XO circuit are disclosed herein. In one embodiment, a metal-oxide semiconductor field-effect transistor (MOSFET) diode with a resistor and a cross-coupled capacitor in the feedback loop is added to each branch of a pair of cross-coupled transistors. At low frequencies, the MOSFET diode acts as a low-impedance load (1/gm), which reduces the loop gain and prevents latching. At higher frequencies, the impedance of the circuit rises to the value of the resistor in the feedback loop of the MOSFET diode and increases the loop gain. The value of the resistor may be appropriately adjusted to provide the high impedance at higher frequencies. In another embodiment, cross-coupled capacitors are added to the MOSFET diodes to give negative resistance at the oscillation frequency. In further embodiments, cross-coupled capacitors and resistors are added to the cross-coupled transistors. Thus, the new embodiments enable the XO circuit to start and sustain oscillation with less additional circuitry and higher swings than other designs of a XO circuit.

After reading this description it will become apparent how to implement the disclosure in various implementations and applications. Although various implementations of the present disclosure will be described herein, it is understood that these implementations are presented by way of example only, and not limitation. As such, this detailed description of various implementations should not be construed to limit the scope or breadth of the present disclosure.

The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
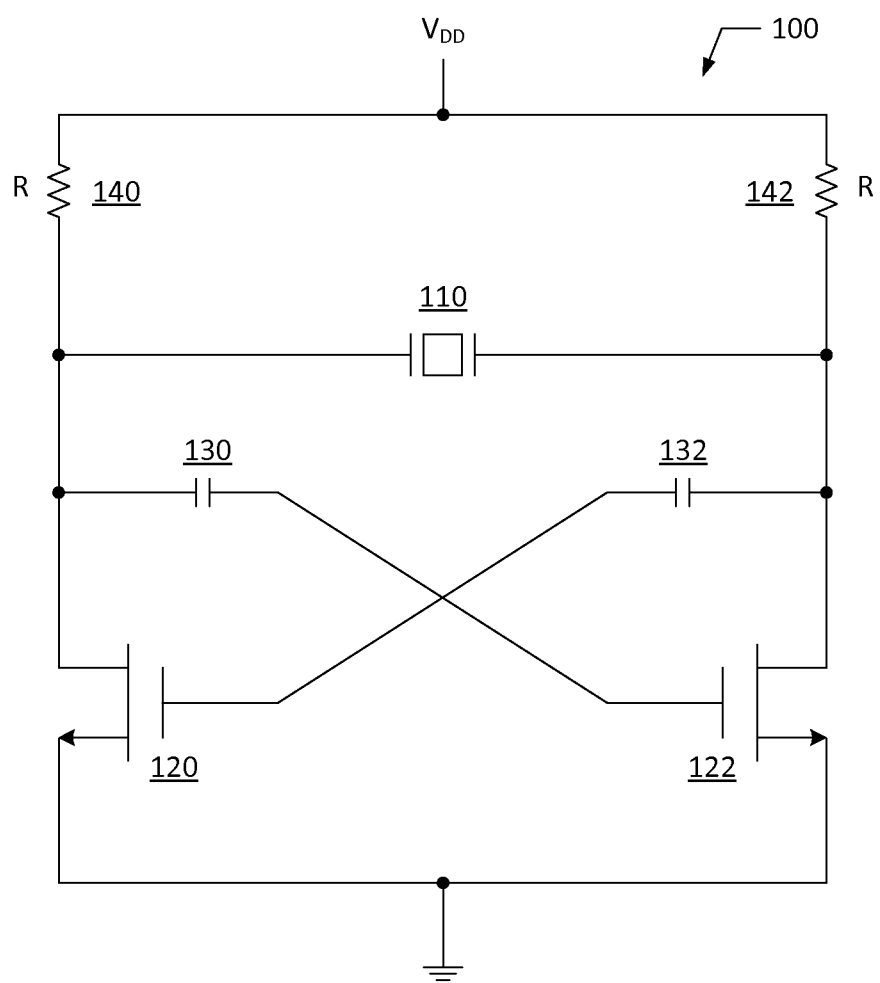
FIG. 1 is a schematic diagram of a conventional differential XO circuit.
Figure 2:
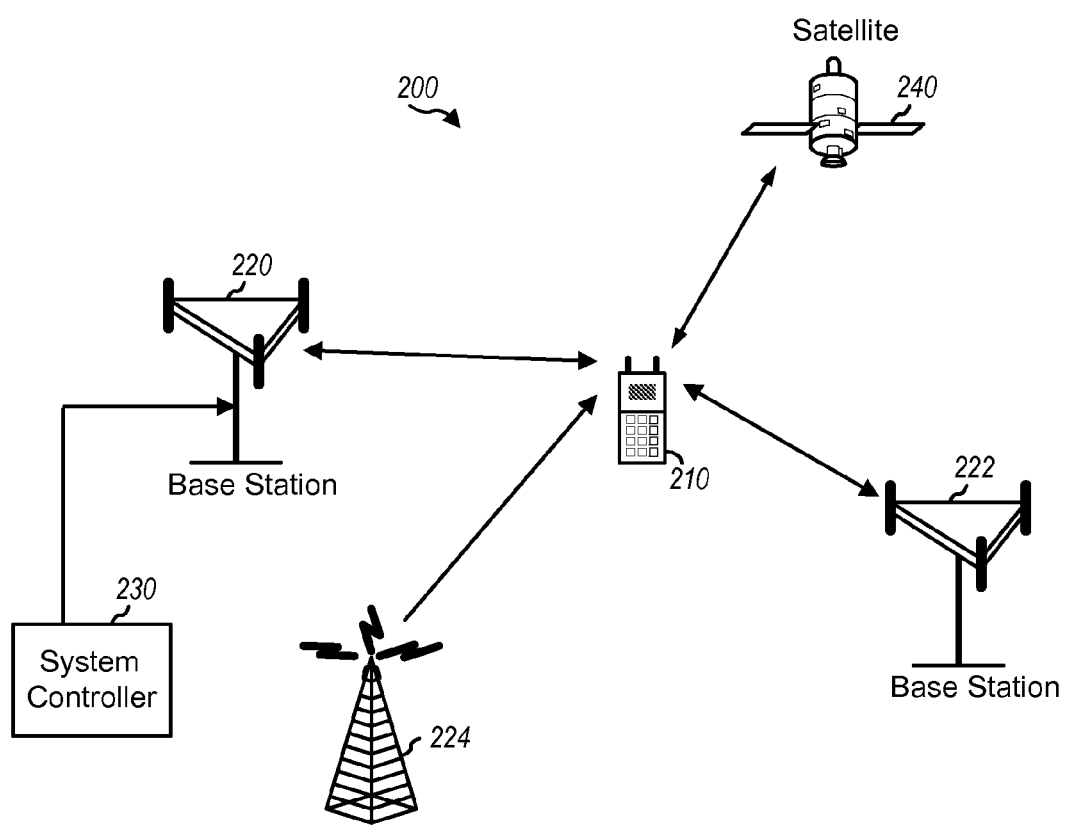
FIG. 2 is an exemplary wireless device communicating with a wireless communication system.

FIG. 2 is an exemplary wireless device 210 communicating with a wireless communication system 200. Wireless communication system 200 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 2 shows wireless communication system 200 including two base stations 220 and 222 and one system controller 230. In general, a wireless system may include any number of base stations and any set of network entities.

Wireless device 210 may also be referred to as a user equipment (UE), a mobile station, a terminal, an access terminal, a subscriber unit, a station, etc. Wireless device 210 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 210 may communicate with wireless system 200. Wireless device 210 may also receive signals from broadcast stations (e.g., broadcast station 224), signals from satellites (e.g., satellite 240) in one or more global navigation satellite systems (GNSS), etc. Wireless device 210 may support one or more radio technologies for wireless communication including LTE, WCDMA, CDMA 1×, EVDO, TD-SCDMA, GSM, 802.11, etc.

Figure 3:
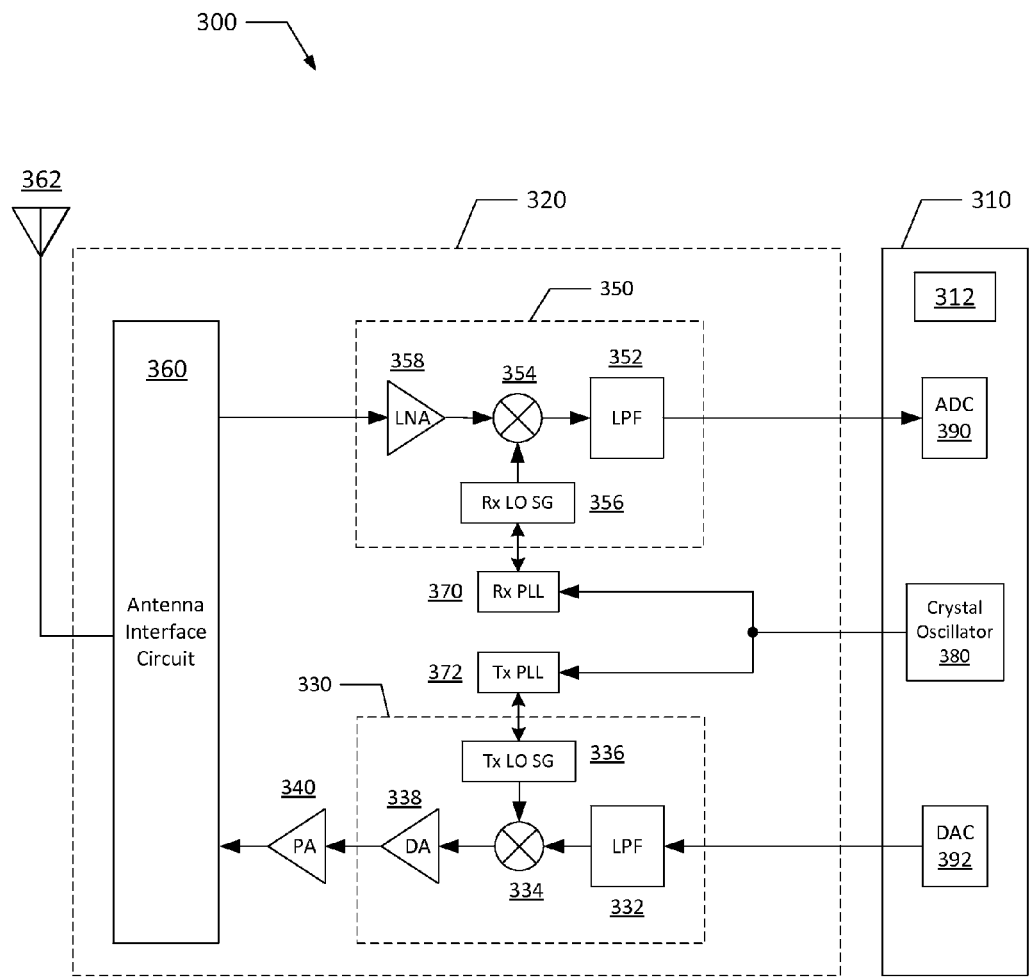
FIG. 3 is a functional block diagram of an exemplary design of a wireless device that is one embodiment of a wireless device shown in FIG. 2.

FIG. 3 is a functional block diagram of an exemplary design of a wireless device 300 that is one embodiment of a wireless device 210 of FIG. 2. In this exemplary design, the wireless device 300 includes a transceiver 320 coupled to an antenna 362, and a data processor/controller 310 having a memory unit 312 to store data and program codes. The transceiver 320 includes, among other blocks, antenna interface circuit 360, a receiver 350, and a transmitter 330 that support bi-directional communication. In general, the wireless device 300 may include any number of transmitters and receivers for any number of communication systems and frequency bands. The data processor/controller 310 includes a memory unit 312, an analog-to-digital converter (ACD) 390, a digital-to-analog converter (DAC) 392, and a crystal oscillator 380. The data processor/controller 310 may perform various functions for the wireless device 300. For example, the data processor/controller 310 may perform processing for data being received via the receiver 350 and data being transmitted via the transmitter 330. The data processor/controller 310 may also control the operation of various circuits within the transceiver 320. The DAC 392 converts the digital data generated in the data processor/controller 310 to an analog output signal and provides the converted analog output signal to the transmitter 330. The ADC 390 converts the analog input signal received from the receiver 350 to the digital data. Memory unit 312 may store program codes and data for the data processor/controller 310. The data processor/controller 310 may be implemented on one or more application specific integrated circuits (ASICs) and/or other integrated circuits (ICs).

In the illustrated embodiment of FIG. 3, the receiver 350 includes a low noise amplifier (LNA) 358, a mixer/downconverter 354, a receiver local oscillator signal generator (Rx LO SG) 356, and a first lowpass filter 352. The Rx LO SG 356 in the receiver 350 receives a signal from a receiver phase locked loop (Rx PLL) 370, which receives a clock signal from a crystal oscillator 380 in the data processor/controller 310. The Rx LO SG 356 may include a frequency divider that receives the clock signal and provides a divider output signal. The clock signal may be generated by a voltage-controlled oscillator (VCO) or some other types of oscillator. The clock signal may also be referred to as a VCO signal, an oscillator signal, etc. In any case, it may be desirable to obtain differential output signals from a frequency divider.

For data reception, antenna 362 receives signals from base stations and/or other transmitter stations and provides a received RF signal, which is routed through an antenna interface circuit 360 and presented as an input RF signal to the receiver 350. The antenna interface circuit 360 may include switches, duplexers, transmit filters, receive filters, matching circuits, etc. Within the receiver 350, the LNA 358 amplifies the input RF signal and provides an output RF signal to the mixer/downconverter 354. The Rx LO SG 356, in combination with the Rx PLL 370, generates a local oscillator signal. As stated above, the Rx PLL 370 receives a clock signal from the crystal oscillator 380. The mixer/downconverter 354 mixes the output RF signal with the generated local oscillator signal to downconvert the output RF signal from RF to baseband. The lowpass filter 352 filters the baseband signal to provide an analog input signal to the ADC 390. The receiver 350 may include other elements such as matching circuits, an oscillator, etc.

In the illustrated embodiment of FIG. 3, the transmitter 330 includes a second lowpass filter 332, a mixer/upconverter 334, a transmitter local oscillator signal generator (Tx LO SG) 336, a driver amplifier (DA) 338, and a power amplifier (PA) 340. The Tx LO SG 336 in the transmitter 330 receives a signal from a transmitter phase locked loop (Tx PLL) 372, which receives a clock signal from the crystal oscillator 280 in the data processor/controller 310. The Tx LO SG 336 may include a frequency divider that receives the clock signal and provides a divider output signal. The clock signal may be generated by a voltage-controlled oscillator (VCO) or some other types of oscillator. The clock signal may also be referred to as a VCO signal, an oscillator signal, etc. In any case, it may be desirable to obtain differential output signals from a frequency divider.

For data transmission, the data processor/controller 310 processes (e.g., encodes and modulates) data to be transmitted and provides a digital data to the DAC 392, which converts the digital data to a baseband analog output signal and provides the converted analog output signal to the transmitter 330, which generates a transmit RF signal. Within the transmitter, the lowpass filter 332 filters the baseband analog signal received from the DAC 392 and sends the filtered signal to the mixer/upconverter 334. The Tx LO SG 336, in combination with the Tx PLL 372, generates a local oscillator signal. As stated above, the Tx PLL 372 receives a clock signal from the crystal oscillator 380. The mixer/upconverter 334 mixes the filtered baseband signal with the generated local oscillator signal to upconvert the baseband signal to the RF signal. The DA 338 and the PA 340 amplify the RF signal sufficiently to drive the antenna 362. The amplified RF signal is routed through the antenna interface circuit 360 and transmitted via antenna 362. The transmitter 330 may include other elements such as matching circuits, an oscillator, etc.

FIG. 3 shows an exemplary transceiver design. In general, the conditioning of the signals in a transmitter and a receiver may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter and receiver. Some circuit blocks in FIG. 3 may also be omitted. All or a portion of transceiver 320 may be implemented on one or more analog integrated circuits (ICs), RF ICs (RFICs), mixed-signal ICs, etc.

Figure 4A:
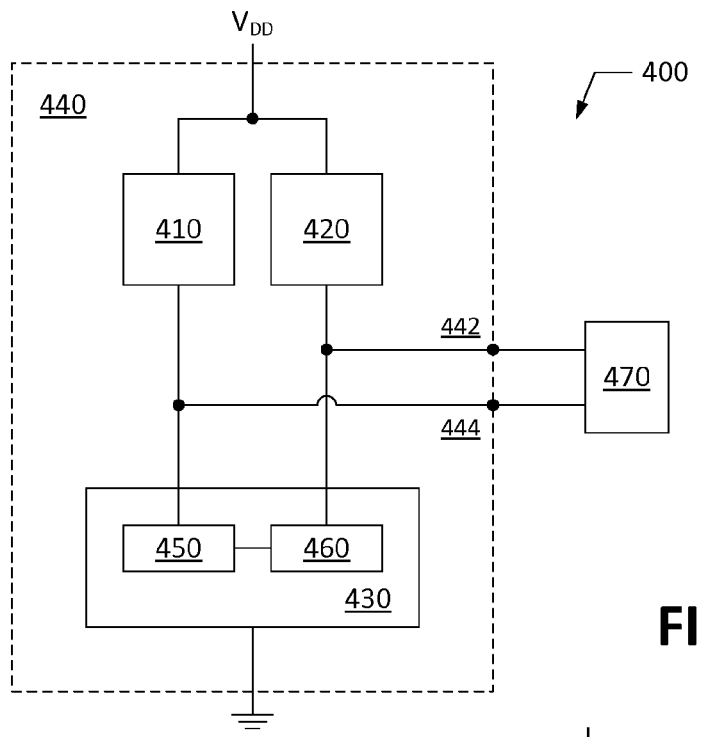
FIG. 4A is a functional block diagram of a differential XO circuit configured on a chip (including a differential oscillator driver circuit) and a reference resonator in accordance with one embodiment of the present disclosure.

FIG. 4A is a functional block diagram of a differential XO circuit 400 configured on a chip (including a differential oscillator driver circuit 440) and a reference resonator 470 in accordance with one embodiment of the present disclosure. In one embodiment, the crystal oscillator 280 shown in FIG. 2 can be configured with the differential XO circuit 400 shown in FIG. 4A. In FIG. 4A, the resonator 470 may be formed from a variety of resonating crystalline materials, including quartz and tourmaline. For example, the resonator 470 may be formed from a piece of quartz that is precisely cut, sized and shaped to resonate at a particular frequency. In one embodiment, the resonator 470 is a quartz resonator. In another embodiment, the resonator 470 is an LC tank resonator.

In the illustrated embodiment of FIG. 4A, the resonator 470 connects to the oscillator driver circuit 440 through a pair of terminals 442, 444, which are output terminals of the oscillator driver circuit 440. The resonator 470 may be mounted off-chip from the differential oscillator driver circuit 440. The oscillator driver circuit 440 includes a cross-coupled oscillation unit 430, including a first part 450 and a second part 460, and a pair of loads 410, 420. The first part 450 is coupled to the load 410 and the second part 460 is coupled to the load 420. Further, the pair of loads 410, 420 is coupled to the supply voltage ($V_{DD}$) and the oscillation unit 430 is connected to the ground voltage. In operation, the differential oscillator driver circuit 440 drives the resonator 470 to oscillate at a particular frequency in order to define a sinusoidal and differential output signal across the two symmetrical output terminals 442, 444 of the differential XO circuit 400. The sinusoidal and differential output signal is suitable for use in various applications, such as phase locked loops, frequency tunable digital filters, direct digital frequency synthesizers, and similarly-functioning devices.

Figure 4B:
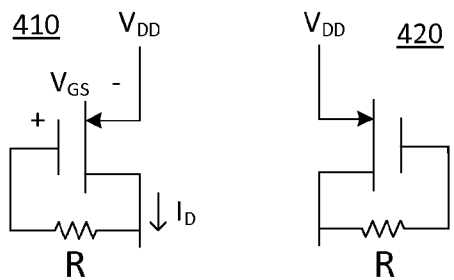
FIG. 4B shows a pair of loads configured as a pair of MOSFET diodes.
Figure 4C:
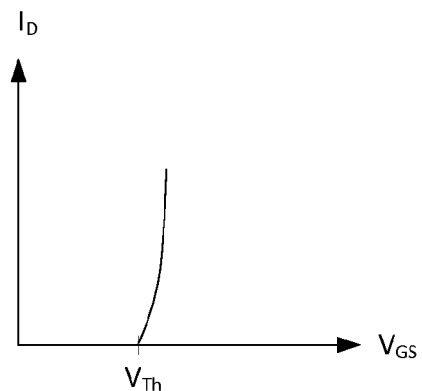
FIG. 4C is a characteristic plot of a MOSFET diode (shown as $I_D$-$V_{GS}$ curve)

In one embodiment shown in FIG. 4B, each of the pair of loads 410, 420 is configured as a MOSFET diode with a resistor (R) in the feedback loop. A typical value for the resistor R is in the range of a few KΩ. In FIG. 4B, the MOSFET diode loads 410, 420 are configured as p-channel MOSFET (PMOS) diodes, which conduct current in only one direction when the voltage at the gate terminal of the PMOS diode exceeds a threshold voltage ($V_{Th}$). As shown in FIG. 4C, beyond the threshold voltage ($V_{Th}$), the characteristic of a MOSFET diode (reflected in the $I_D$-$V_{GS}$ curve) appears very similar to a diode with quadratic I-V characteristics.

Referring back to FIG. 4B, the resistor (R) is connected between the gate terminal and the drain terminal of the PMOS transistor in the PMOS diode. The source terminal of the PMOS transistor in the PMOS diode is connected to the supply voltage ($V_{DD}$). Accordingly, the impedances of the MOSFET diode loads 410, 420 are low ($1/g_m$) at low frequencies, because the feedback resistor (R) is disconnected, and the impedances of the MOSFET diode loads 410, 420 at high frequencies are high at the value of the feedback resistor (R). As stated above, the low impedance of the load at the low frequencies reduces the loop gain and prevents latching. Further, the high impedance of the load at the higher frequencies increases the impedance of the circuit to the value of the resistor in the feedback loop and increases the loop gain. In other embodiments, the loads 410, 420 may be configured as n-channel MOSFET (NMOS) diodes with the resistor (R) connected between the gate terminal and the drain terminal of each of the NMOS diodes with the source terminals of the NMOS diodes connected to the ground voltage.

Figure 4D:
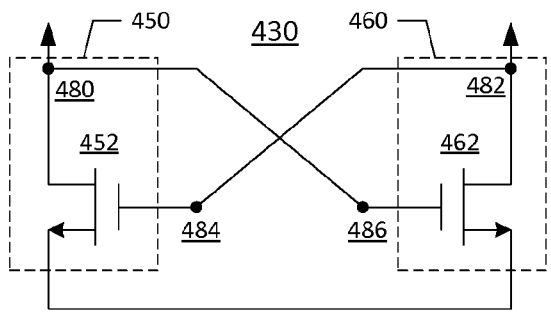
FIG. 4D is a functional diagram of a cross-coupled oscillation unit include a pair of transistors.

In one embodiment shown in FIG. 4D, the main oscillation unit 430 (which includes a first part 450 and a second part 460) is configured as a cross-coupled pair of transistors 452, 462. In this embodiment, the gate terminal 484 of the first transistor 452 is connected to the drain terminal 482 of the second transistor 462, while the gate terminal 486 of the second transistor 462 is connected to the drain terminal 480 of the first transistor 452. In the illustrated embodiment of FIG. 4D, the cross-coupled pair of transistors 452, 462 is configured with NMOS transistors.

Figure 5:
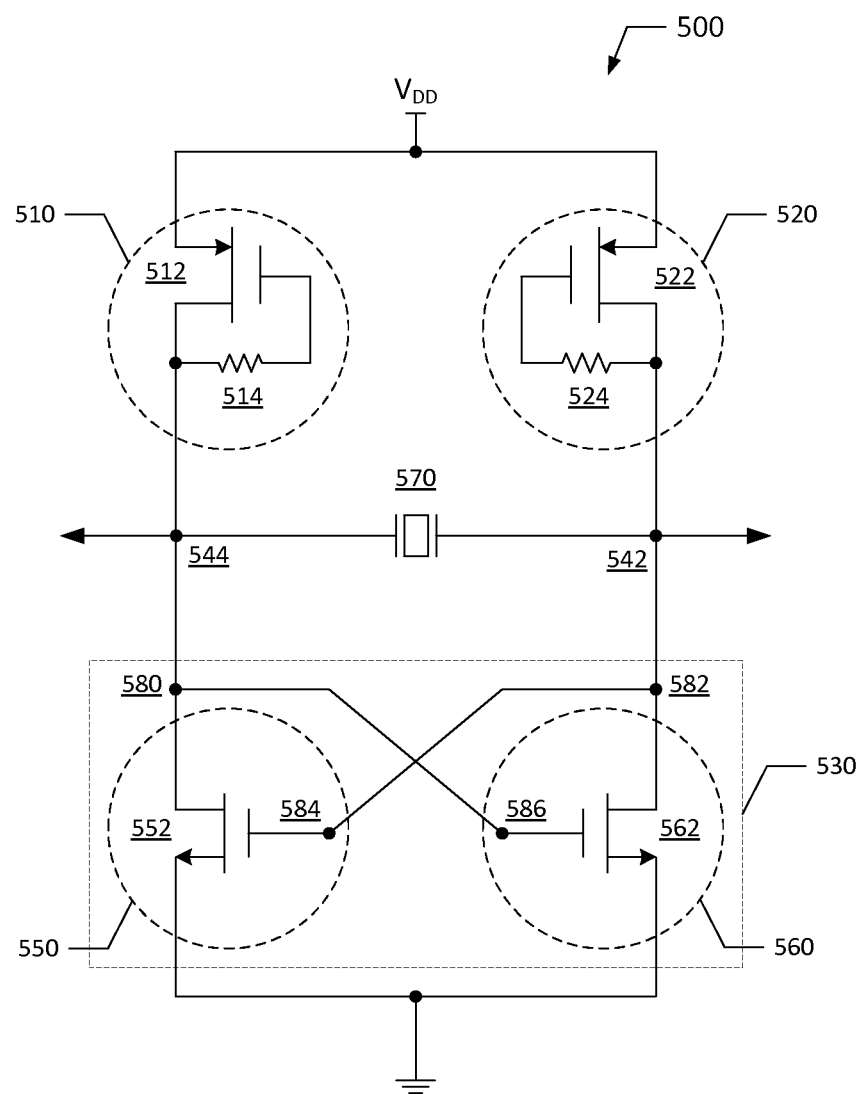
FIG. 5 is a schematic diagram of a differential XO circuit configured in accordance with one embodiment of the present disclosure.

FIG. 5 is a schematic diagram of a differential XO circuit 500 configured in accordance with one embodiment of the present disclosure. In the illustrated embodiment of FIG. 5, a cross-coupled pair of NMOS transistors 552, 562 is arranged in a differential configuration with a first transistor 552 in a first part 550 of a main oscillation unit 530 and a second transistor 562 in a second part 560 of the main oscillation unit 530. The gate terminal 584 of the first transistor 552 is connected to the drain terminal 582 of the second transistor 562, while the gate terminal 586 of the second transistor 562 is connected to the drain terminal 580 of the first transistor 552.

An off-chip reference resonator 570 is connected to the drain terminals 580, 582 of the first and second transistors 552, 562. Further, the drain terminal 580 of the first transistor 552 is connected to the drain terminal of a PMOS transistor 512 in the first PMOS diode 510, which includes a resistor 514 with value R in the feedback loop between the gate terminal and the drain terminal. Correspondingly, the drain terminal 582 of the second transistor 562 is connected to the drain terminal of a PMOS transistor 522 in the second PMOS diode 520, which includes a resistor 524 with value R in the feedback loop between the gate terminal and the drain terminal.

In FIG. 5, the first PMOS diode 510 acts as a low-impedance load ($1/g_m$) at low frequencies and acts as a high-impedance load (R) at higher frequencies, for the first part 550. The second PMOS diode 520 acts as a low-impedance load ($1/g_m$) at low frequencies and acts as a high-impedance load (R) at higher frequencies, for the second part 560. In operation, when the voltage at the gate terminal of the PMOS transistor 512 in the PMOS diode 510 exceeds a threshold voltage, the power supply supplies the current to the source terminal and through to the drain terminal of the PMOS transistor 512. Further, when the voltage at the gate terminal of the PMOS transistor 522 in the PMOS diode 520 exceeds the threshold voltage, the power supply supplies the current to the source terminal and through to the drain terminal of the PMOS transistor 522. The voltages at the gate terminals of the PMOS transistors 512, 522 are determined by the oscillation voltage of the reference resonator 570. Although the transistors 552, 562 are configured with NMOS transistors in the embodiment shown in FIG. 5, the transistors 552, 562 can be configured with PMOS transistors.

Node 544 connects to one terminal of the reference resonator 570, the drain terminal 580 of the first NMOS transistor 552, and the drain terminal of the first PMOS transistor 512. Further, node 542 connects to the other terminal of the reference resonator 570, the drain terminal 582 of the second NMOS transistor 562, and the drain terminal of the second PMOS transistor 522. The source terminals of the first and second PMOS transistors 512, 522 are connected together to the supply voltage ($V_{DD}$), while the source terminals of the first and second NMOS transistors 552, 562 are connected together to the ground voltage.

Figure 6:
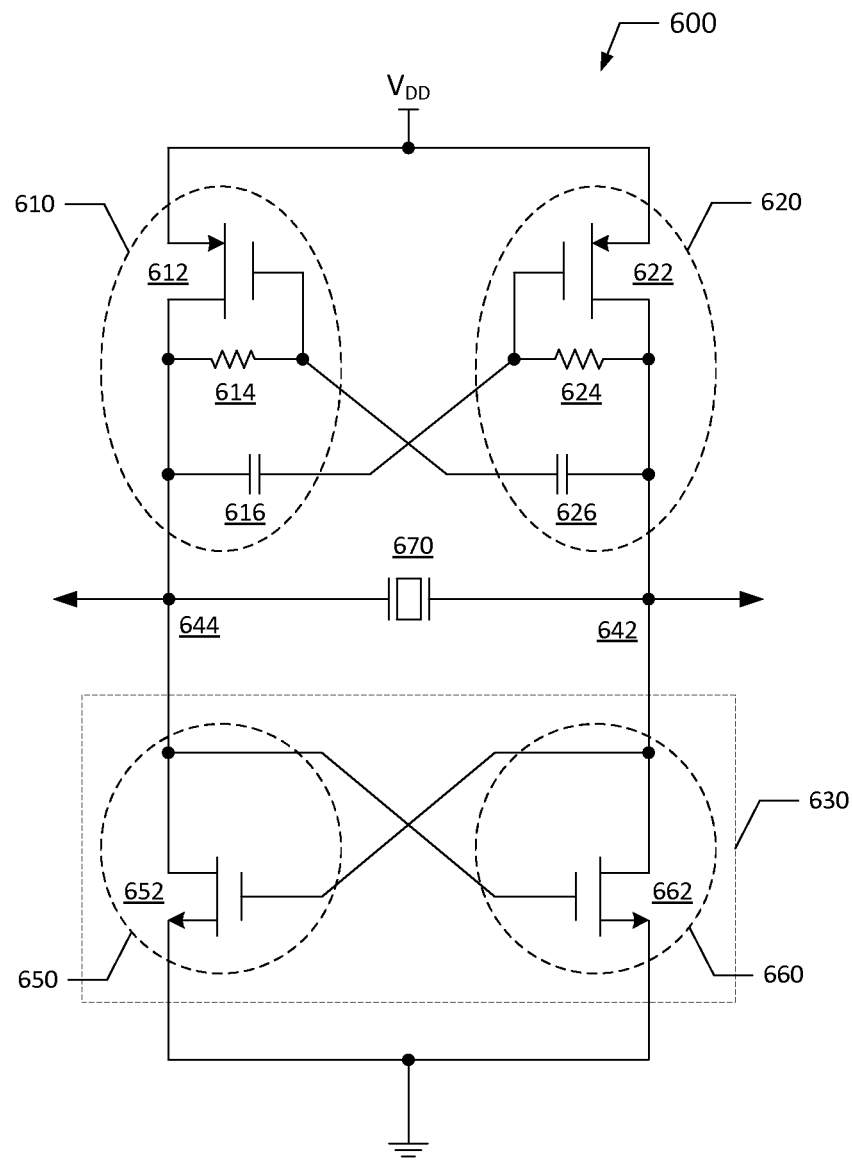
FIG. 6 is a schematic diagram of a differential XO circuit configured in accordance with another embodiment of the present disclosure.

FIG. 6 is a schematic diagram of a differential XO circuit 600 configured in accordance with another embodiment of the present disclosure. In FIG. 6, a cross-coupled pair of capacitors 616, 626 is added to the XO circuit of FIG. 5 to give negative resistance at the oscillation frequency.

In the illustrated embodiment of FIG. 6, a cross-coupled pair of NMOS transistors 652, 662 is arranged in a differential configuration with a first transistor 652 in a first part 650 of a main oscillation unit 630 and a second transistor 662 in a second part 660 of the main oscillation unit 630. The gate terminal of the first transistor 652 is connected to the drain terminal of the second transistor 662, while the gate terminal of the second transistor 662 is connected to the drain terminal of the first transistor 652.

An off-chip reference resonator 670 is connected to the drain terminals of the first and second transistors 652, 662. Further, the drain terminal of the first transistor 652 is connected to the drain terminal of a PMOS transistor 612 in the first PMOS diode 610, which includes a resistor 614 with value R in the feedback loop between the gate terminal and the drain terminal. Correspondingly, the drain terminal of the second transistor 662 is connected to the drain terminal of a PMOS transistor 622 in the second PMOS diode 620, which includes a resistor 624 with value R in the feedback loop between the gate terminal and the drain terminal. As stated above, a cross-coupled pair of capacitors 616, 626 is added to the first and second PMOS diodes 610, 620. The capacitor 616 is cross coupled between the drain terminal of the PMOS transistor 612 and the gate terminal of the PMOS transistor 622, while the capacitor 626 is cross coupled between the drain terminal of the PMOS transistor 622 and the gate terminal of the PMOS transistor 612.

In FIG. 6, the first PMOS diode 610 acts as a low-impedance load ($1/g_m$) at low frequencies and acts as a high-impedance load (R) at higher frequencies, for the first part 650. The second PMOS diode 620 acts as a low-impedance load ($1/g_m$) at low frequencies and acts as a high-impedance load (R) at higher frequencies, for the second part 660. In operation, when the voltage at the gate terminal of the PMOS transistor 612 in the PMOS diode 610 exceeds a threshold voltage, the power supply supplies the current to the source terminal and through to the drain terminal of the PMOS transistor 612. Further, when the voltage at the gate terminal of the PMOS transistor 622 in the PMOS diode 620 exceeds the threshold voltage, the power supply supplies the current to the source terminal and through to the drain terminal of the PMOS transistor 622. The voltages at the gate terminals of the PMOS transistors 612, 622 are determined by the oscillation voltage of the reference resonator 670. As stated above, adding the cross-coupled pair of capacitors 616, 626 to the first and second PMOS diodes 610, 620 provides negative resistance at the oscillation frequency. Although the transistors 652, 662 are configured with NMOS transistors in the embodiment shown in FIG. 6, the transistors 652, 662 can be configured with PMOS transistors.

Node 644 connects to one terminal of the reference resonator 670, the drain terminal of the first NMOS transistor 652, and the drain terminal of the first PMOS transistor 612. Further, node 642 connects to the other terminal of the reference resonator 670, the drain terminal of the second NMOS transistor 662, and the drain terminal of the second PMOS transistor 622. The source terminals of the first and second PMOS transistors 612, 622 are connected together to the supply voltage ($V_{DD}$), while the source terminals of the first and second NMOS transistors 652, 662 are connected together to the ground voltage.

Figure 7:
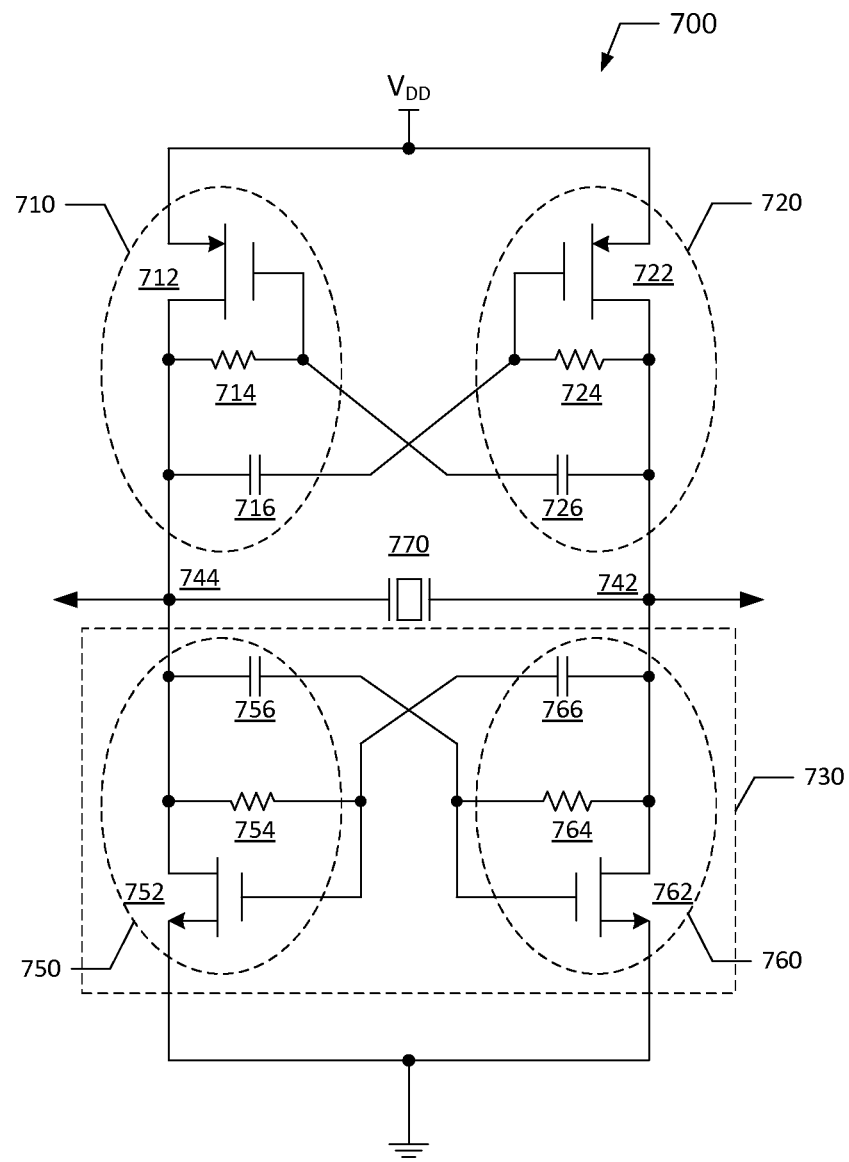
FIG. 7 is a schematic diagram of a differential XO circuit configured in accordance with another embodiment of the present disclosure.

FIG. 7 is a schematic diagram of a differential XO circuit 700 configured in accordance with another embodiment of the present disclosure. In FIG. 7, a pair of resistors 754, 764 and a second cross-coupled pair of capacitors 756, 766 are coupled to the cross-coupled pair of transistors 752, 762. Thus, in FIG. 7, the first part 750 includes a first NMOS transistor 752, a resistor 754, and a cross-coupled capacitor 756, while the second part 760 includes a second NMOS transistor 762, a resistor 764, and a cross-coupled capacitor 766. The configuration of FIG. 7 provides a close-to-zero DC gain which may provide an improvement of current reduction with better phase noise due to a higher effective transconductance (Gm).

In the illustrated embodiment of FIG. 7, a cross-coupled pair of NMOS transistors 752, 762 is arranged in a differential configuration with a first transistor 752 in a first part 750 of a main oscillation unit 730 and a second transistor 762 in a second part 760 of the main oscillation unit 730. The first part 750 also includes a resistor 754 and a cross-coupled capacitor 756. The second part 760 also includes a resistor 764, and a cross-coupled capacitor 766. Thus, the gate terminal of the first transistor 752 is connected to the drain terminal of the second transistor 762 through the cross-coupled capacitor 766. Further, the gate terminal of the second transistor 762 is connected to the drain terminal of the first transistor 752 through the cross-coupled capacitor 756. The resistor 754 is coupled between the gate terminal and the drain terminal of the first transistor 752, while the resistor 764 is coupled between the gate terminal and the drain terminal of the second transistor 762.

An off-chip reference resonator 770 is connected to the drain terminals of the first and second transistors 752, 762. Further, the drain terminal of the first transistor 752 is connected to the drain terminal of a PMOS transistor 712 in the first PMOS diode 710, which includes a resistor 714 with value R in the feedback loop between the gate terminal and the drain terminal. Correspondingly, the drain terminal of the second transistor 762 is connected to the drain terminal of a PMOS transistor 722 in the second PMOS diode 720, which includes a resistor 724 with value R in the feedback loop between the gate terminal and the drain terminal. As stated above, a cross-coupled pair of capacitors 716, 726 is added to the first and second PMOS diodes 710, 720. The capacitor 716 is cross coupled between the drain terminal of the PMOS transistor 712 and the gate terminal of the PMOS transistor 722, while the capacitor 726 is cross coupled between the drain terminal of the PMOS transistor 722 and the gate terminal of the PMOS transistor 712.

In FIG. 7, the first PMOS diode 710 acts as a low-impedance load ($1/g_m$) at low frequencies and acts as a high-impedance load (R) at higher frequencies, for the first part 750. The second PMOS diode 720 acts as a low-impedance load ($1/g_m$) at low frequencies and acts as a high-impedance load (R) at higher frequencies, for the second part 760. In operation, when the voltage at the gate terminal of the PMOS transistor 712 in the PMOS diode 710 exceeds a threshold voltage, the power supply supplies the current to the source terminal and through to the drain terminal of the PMOS transistor 712. Further, when the voltage at the gate terminal of the PMOS transistor 722 in the PMOS diode 720 exceeds the threshold voltage, the power supply supplies the current to the source terminal and through to the drain terminal of the PMOS transistor 722. The voltages at the gate terminals of the PMOS transistors 712, 722 are determined by the oscillation voltage of the reference resonator 770. Adding the cross-coupled pair of capacitors 716, 726 to the first and second PMOS diodes 710, 720 provides negative resistance at the oscillation frequency. Although the transistors 752, 762 are configured with NMOS transistors in the embodiment shown in FIG. 7, the transistors 752, 762 can be configured with PMOS transistors.

Node 744 connects to one terminal of the reference resonator 770, the drain terminal of the first NMOS transistor 752, and the drain terminal of the first PMOS transistor 712. Further, node 742 connects to the other terminal of the reference resonator 770, the drain terminal of the second NMOS transistor 762, and the drain terminal of the second PMOS transistor 722. The source terminals of the first and second PMOS transistors 712, 722 are connected together to the supply voltage ($V_{DD}$), while the source terminals of the first and second NMOS transistors 752, 762 are connected together to the ground voltage.

Figure 8:
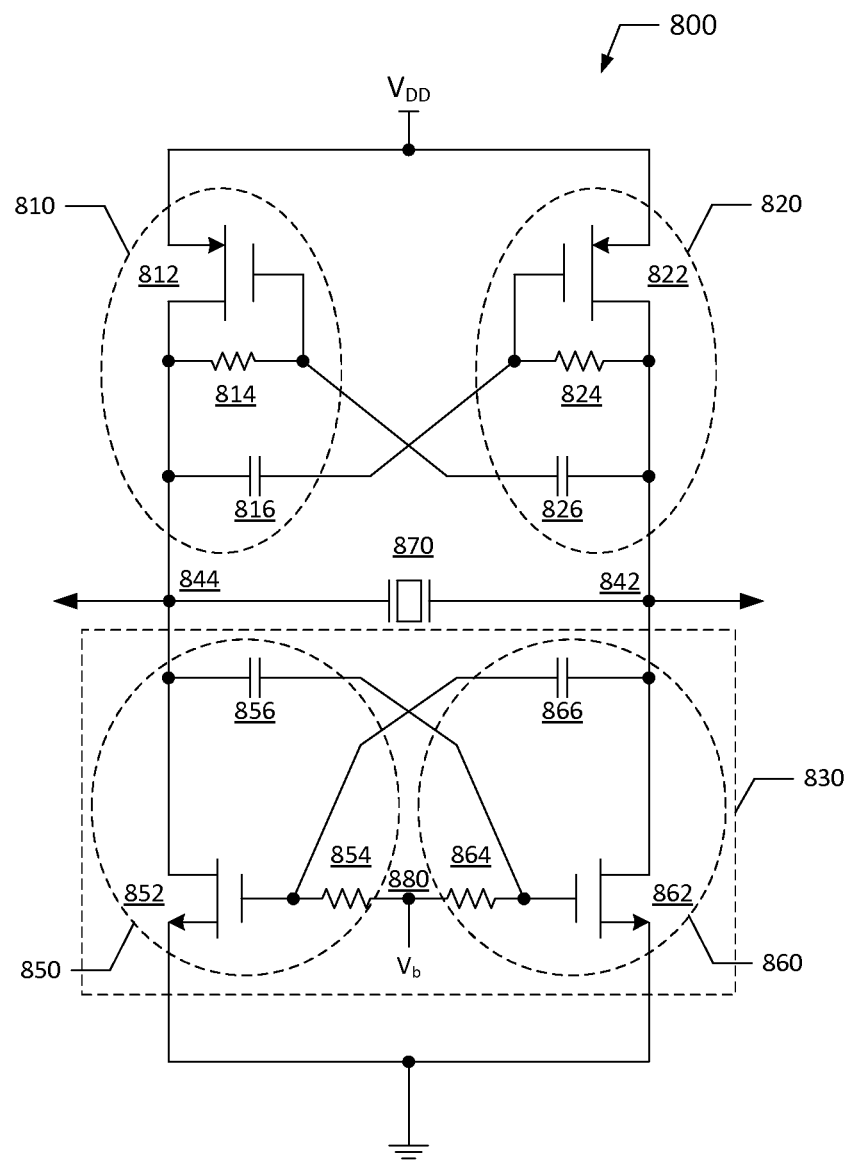
FIG. 8 is a schematic diagram of a differential XO circuit configured in accordance with yet another embodiment of the present disclosure.

FIG. 8 is a schematic diagram of a differential XO circuit 800 configured in accordance with yet another embodiment of the present disclosure. In FIG. 8, a pair of resistors 854, 864 and a second cross-coupled pair of capacitors 856, 866 are coupled to the cross-coupled pair of transistors 852, 862. Thus, in FIG. 8, the first part 850 includes a first NMOS transistor 852, a resistor 854, and a cross-coupled capacitor 856, while the second part 860 includes a second NMOS transistor 862, a resistor 864, and a cross-coupled capacitor 866. However, in the embodiment of FIG. 8, the second cross-coupled pair of capacitors 856, 866 is coupled in the same manner as FIG. 7, while the pair of resistors 854, 864 is coupled across the gate terminals of the transistors 852, 862 with a bias insertion node 880 for inputting a bias voltage at the connection between the resistors 854, 864. This bias insertion node 880 for inputting the bias voltage enables separate control over the device bias to enable lower $V_{DD}$.

In the illustrated embodiment of FIG. 8, a cross-coupled pair of NMOS transistors 852, 862 is arranged in a differential configuration with a first transistor 852 in a first part 850 of a main oscillation unit 830 and a second transistor 862 in a second part 860 of the main oscillation unit 830. The first part 850 also includes a resistor 854 and a cross-coupled capacitor 856. The second part 860 also includes a resistor 864, and a cross-coupled capacitor 866. Thus, the gate terminal of the first transistor 852 is connected to the drain terminal of the second transistor 862 through the cross-coupled capacitor 866. Further, the gate terminal of the second transistor 862 is connected to the drain terminal of the first transistor 852 through the cross-coupled capacitor 856. A first end of the resistor 854 connects to the gate terminal of the first transistor 852, while a first end of the resistor 864 connects to the gate terminal of the second transistor 862. The second end of the resistor 854 connects to the second end of the resistor 864. As stated above, a bias voltage is input to the connection point between the two resistors 854, 864 to enable lower $V_{DD}$.

An off-chip reference resonator 870 is connected to the drain terminals of the first and second transistors 852, 862. Further, the drain terminal of the first transistor 852 is connected to the drain terminal of a PMOS transistor 812 in the first PMOS diode 810, which includes a resistor 814 with value R in the feedback loop between the gate terminal and the drain terminal. Correspondingly, the drain terminal of the second transistor 862 is connected to the drain terminal of a PMOS transistor 822 in the second PMOS diode 820, which includes a resistor 824 with value R in the feedback loop between the gate terminal and the drain terminal. A cross-coupled pair of capacitors 816, 826 is added to the first and second PMOS diodes 810, 820. The capacitor 816 is cross coupled between the drain terminal of the PMOS transistor 812 and the gate terminal of the PMOS transistor 822, while the capacitor 826 is cross coupled between the drain terminal of the PMOS transistor 822 and the gate terminal of the PMOS transistor 812.

In FIG. 8, the first PMOS diode 810 acts as a low-impedance load ($1/g_m$) at low frequencies and acts as a high-impedance load (R) at higher frequencies, for the first part 850. The second PMOS diode 820 acts as a low-impedance load ($1/g_m$) at low frequencies and acts as a high-impedance load (R) at higher frequencies, for the second part 860. In operation, when the voltage at the gate terminal of the PMOS transistor 812 in the PMOS diode 810 exceeds a threshold voltage, the power supply supplies the current to the source terminal and through to the drain terminal of the PMOS transistor 812. Further, when the voltage at the gate terminal of the PMOS transistor 822 in the PMOS diode 820 exceeds the threshold voltage, the power supply supplies the current to the source terminal and through to the drain terminal of the PMOS transistor 822. The voltages at the gate terminals of the PMOS transistors 812, 822 are determined by the oscillation voltage of the reference resonator 870. Adding the cross-coupled pair of capacitors 816, 826 to the first and second PMOS diodes 810, 820 provides negative resistance at the oscillation frequency. Although the transistors 852, 862 are configured with NMOS transistors in the embodiment shown in FIG. 8, the transistors 852, 862 can be configured with PMOS transistors.

Node 844 connects to one terminal of the reference resonator 870, the drain terminal of the first NMOS transistor 852, and the drain terminal of the first PMOS transistor 812. Further, node 842 connects to the other terminal of the reference resonator 870, the drain terminal of the second NMOS transistor 862, and the drain terminal of the second PMOS transistor 822. The source terminals of the first and second PMOS transistors 812, 822 are connected together to the supply voltage ($V_{DD}$), while the source terminals of the first and second NMOS transistors 852, 862 are connected together to the ground voltage.

Figure 9:
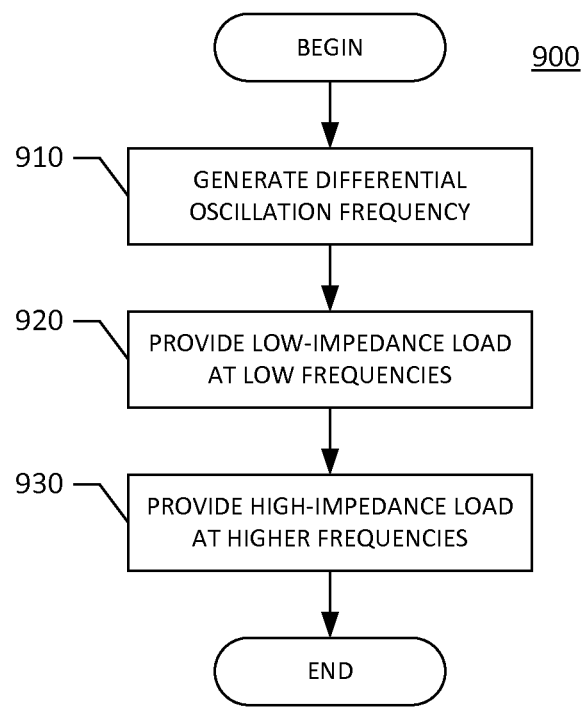
FIG. 9 is a functional flow diagram illustrating a method for generating an oscillation frequency at output terminals of a differential oscillator circuit in accordance with one embodiment of the present disclosure.

FIG. 9 is a functional flow diagram illustrating a method 900 for generating an oscillation frequency at output terminals of a differential oscillator circuit in accordance with one embodiment of the present disclosure. In one embodiment, the differential oscillation frequency is generated, at block 910, using a cross-coupled oscillation unit (e.g., unit 630) and a reference resonator (e.g., unit 670) coupled between the output terminals (e.g., nodes 644, 642) of the differential oscillator circuit (e.g., circuit 600). In one embodiment shown in FIG. 6, the main oscillation unit 630 comprises a cross-coupled pair of transistors 652, 662. The cross-coupled pair of transistors 652, 662 is arranged in a differential configuration, wherein the gate terminal of a first transistor 652 is connected to the drain terminal of a second transistor 662, while the gate terminal of the second transistor 662 is connected to the drain terminal of the first transistor 652. The reference resonator 670 is generally configured to be located off-chip from the differential oscillation circuit.

At block 920, a low-impedance load is provided at low frequencies with a pair of MOSFET diodes (e.g., MOSFET diodes 610, 620) coupled to the cross-coupled pair of transistors (e.g., transistors 652, 662). The low-impedance load at the low frequencies is the inverse of the transconductance (1/gm), which is a very small value. At step 930, a high-impedance load is provided at higher frequencies with the same pair of MOSFET diodes (e.g., MOSFET diodes 610, 620) coupled to the cross-coupled pair of transistors (e.g., transistors 652, 662). The high-impedance load at the higher frequencies is the value of the resistor (R) in the feedback of the MOSFET diode, between the gate and the drain terminals. The value R of the resistor should be adjusted to provide the high-impedance load.

Regarding blocks 920 and 930 of providing a load using a pair of MOSFET diodes, FIG. 6, among other figures, provides an example. In the embodiment shown in FIG. 6, the pair of MOSFET diodes 610, 620 includes transistors 612, 622, resistors 614, 624, and a pair of cross-coupled capacitors 616, 618. The resistor 614 is coupled between the drain and gate terminals of transistor 612, while the resistor 624 is coupled between the drain and gate terminal of transistor 622. The capacitor 616 is cross coupled between the drain terminal of the transistor 612 and the gate terminal of the transistor 622.

Regarding block 910 of generating a differential oscillation frequency using a main oscillation unit, FIGS. 7 and 8, among other figures, provide examples. In the embodiment shown in FIG. 7, a main oscillation unit 730 includes a first part 750 having a first transistor 752 and a second part 760 having a second transistor 762. The first part 750 also includes a resistor 754 and a cross-coupled capacitor 756. The second part 760 also includes a resistor 764, and a cross-coupled capacitor 766. Thus, the gate terminal of the first transistor 752 is connected to the drain terminal of the second transistor 762 through the cross-coupled capacitor 766. Further, the gate terminal of the second transistor 762 is connected to the drain terminal of the first transistor 752 through the cross-coupled capacitor 756. The resistor 754 is coupled between the gate terminal and the drain terminal of the first transistor 752, while the resistor 764 is coupled between the gate terminal and the drain terminal of the second transistor 762. In the embodiment shown in FIG. 8, a main oscillation unit 830 includes a first part 850 having a first transistor 852 and a second part 860 having a second transistor 862. The first part 850 also includes a resistor 854 and a cross-coupled capacitor 856. The second part 860 also includes a resistor 864, and a cross-coupled capacitor 866. Thus, the gate terminal of the first transistor 852 is connected to the drain terminal of the second transistor 862 through the cross-coupled capacitor 866. Further, the gate terminal of the second transistor 862 is connected to the drain terminal of the first transistor 852 through the cross-coupled capacitor 856. A first end of the resistor 854 connects to the gate terminal of the first transistor 852, while a first end of the resistor 864 connects to the gate terminal of the second transistor 862. The second end of the resistor 854 connects to the second end of the resistor 864. A bias voltage is input to the connection point between the two resistors 854, 864 to enable lower $V_{DD}$.

Although several embodiments of the disclosure are described above, many variations of the disclosure are possible. For example, although the illustrated embodiments of FIGS. 4A, 5, 6, 7, and 8 show that the reference resonator 470, 570, 670, 770, 870 is configured to be off chip, the reference resonator can be configured to be on chip. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A circuit, comprising:
   first and second output terminals;
   a reference resonator coupled between the first and second output terminals;
   a cross-coupled oscillation unit coupled to the first and second output terminals;
   a first metal-oxide semiconductor field-effect transistor (MOSFET) diode coupled in series to the cross-coupled oscillation unit at the first output terminal, the first MOSFET diode including a first transistor, a first resistor coupled between gate and drain terminals of the first transistor, and a first capacitor;
   a second MOSFET diode coupled in series to the cross-coupled oscillation unit at the second output terminal, the second MOSFET diode including a second transistor, a second resistor coupled between gate and drain terminals of the second transistor, and a second capacitor cross coupled between the drain terminal of the second transistor and the gate terminal of the first transistor,
   wherein the first capacitor is cross coupled between the drain terminal of the first transistor and the gate terminal of the second transistor;
   wherein the cross-coupled oscillation unit further comprises:
      third and fourth transistors cross-coupled to the first and second output terminals;
      a third capacitor cross coupled between a drain terminal of the third transistor and a gate terminal of the fourth transistor; and
      a fourth capacitor cross coupled between a drain terminal of the fourth transistor and a gate terminal of the third transistor; and
   a bias insertion node coupled between the gate terminals of the third and fourth transistors of the cross-coupled oscillation unit.

2. The circuit of claim 1, wherein the cross-coupled oscillation unit further comprises:
   a third resistor coupled between the gate and drain terminals of the third transistor; and
   a fourth resistor coupled between the gate and drain terminals of the fourth transistor.

3. The circuit of claim 1, wherein the cross-coupled oscillation unit further comprises
   a third resistor coupled between the gate terminal of the third transistor and the bias insertion node.

4. The circuit of claim 1, wherein the cross-coupled oscillation unit further comprises
   a fourth resistor coupled between the gate terminal of the fourth transistor and the bias insertion node.

5. The circuit of claim 1, wherein the first and second MOSFET diodes are configured as first and second p-channel MOSFET diodes, respectively.

6. The circuit of claim 5, wherein source terminals of the first and second transistors in the first and second p-channel MOSFET diodes, respectively, are coupled to a supply voltage.

7. The circuit of claim 1, wherein the third and fourth transistors are configured as first and second n-channel MOSFET transistors.

8. The circuit of claim 7, wherein source terminals of the first and second n-channel MOSFET transistors are coupled to a ground voltage.

9. The circuit of claim 1, wherein the drain terminals of the first and second transistors in the first and second MOSFET diodes, respectively, are coupled to the drain terminals of the third and fourth transistors of the cross-coupled oscillation unit.

10. A method of generating an oscillation frequency at first and second output terminals of a differential oscillator circuit, the method comprising:
    generating the oscillation frequency using a cross-coupled oscillation unit including a reference resonator coupled between the first and second output terminals;
    providing a low-impedance load at low frequencies and a high-impedance load at higher frequencies by coupling first and second MOSFET diodes to the cross-coupled oscillation unit,
    wherein the first MOSFET diode includes a first transistor that is coupled in series to the cross-coupled oscillation unit at the first output terminal and the second MOSFET diode includes a second transistor that is coupled in series to the cross-coupled oscillation unit at the second output terminal,
    wherein each of the first and second MOSFET diodes also includes a resistor and a cross-coupled capacitor;
    cross coupling a third capacitor between a drain terminal of a third transistor of the cross-coupled oscillation unit and a gate terminal of a fourth transistor of the cross-coupled oscillation unit;
    cross coupling a fourth capacitor a drain terminal of the fourth transistor and a gate terminal of the third transistor; and
    coupling a bias insertion node between the gate terminals of the third and fourth transistors of the cross-coupled oscillation unit.

11. The method of claim 10, wherein providing a low-impedance load at low frequencies and a high-frequency load at higher frequencies by coupling first and second MOSFET diodes comprises:
    cross coupling a first capacitor of the first MOSFET diode between a drain terminal of the first transistor and a gate terminal of the second transistor; and
    cross coupling a second capacitor of the second MOSFET diode between a drain terminal of the second transistor and a gate terminal of the first transistor.

12. The method of claim 10, further comprising:
    coupling a third resistor between gate and drain terminals of the third transistor; and
    coupling a fourth resistor between gate and drain terminals of the fourth transistor.

13. The method of claim 10, further comprising
    coupling a third resistor between the gate terminal of the third transistor and the bias insertion node.

14. The method of claim 10, further comprising
    coupling a fourth resistor between the gate terminal of the fourth transistor and the bias insertion node.

15. An apparatus for generating an oscillation frequency at first and second output terminals of a differential oscillator circuit, the apparatus comprising:
- means for generating the oscillation frequency coupled between the first and second output terminals,
- wherein the means for generating the oscillation frequency includes a third transistor and a fourth transistor;
- means for providing a low-impedance load at low frequencies and a high-impedance load at higher frequencies to the means for generating the oscillation frequency,
- wherein the means for providing includes first and second diode means, the first diode means includes a first transistor coupled in series to the means for generating the oscillation frequency at the first output terminal and the second diode means includes a second transistor coupled in series to the means for generating the oscillation frequency at the second output terminal,
- wherein each of the first and second diode means also includes a resistor and a cross-coupled capacitor;
- means for cross coupling a third capacitor between a drain terminal of the third transistor and a gate terminal of the fourth transistor;
- means for cross coupling a fourth capacitor between a drain terminal of the fourth transistor and a gate terminal of the third transistor; and
- means for inserting a bias signal into a bias node between the gate terminals of the third and fourth transistors of the means for generating the oscillation frequency.

16. The apparatus of claim 15, wherein the means for providing comprises:
- means for cross coupling a first capacitor of the first diode means between a drain terminal of the first transistor and a gate terminal of the second transistor; and
- means for cross coupling a second capacitor of the second diode means between a drain terminal of the second transistor and a gate terminal of the first transistor.

17. The apparatus of claim 15, further comprising:
- means for coupling a third resistor between gate and drain terminals of the third transistor; and
- means for coupling a fourth resistor between gate and drain terminals of the fourth transistor.

18. The apparatus of claim 15, further comprising
- means for coupling a third resistor between the gate terminal of the third transistor and the bias insertion node.

19. The apparatus of claim 15, further comprising
- means for coupling a fourth resistor between the gate terminal of the fourth transistor and the bias insertion node.

20. A device, comprising:
- first and second output terminals;
- a cross-coupled oscillation unit configured to start and sustain oscillation at an oscillation frequency, the cross-coupled oscillation unit is coupled to the first and second output terminals;
- first and second diode loads coupled to the cross-coupled oscillation unit to provide a low-impedance load at low frequencies and a high-impedance load at higher frequencies to the cross-coupled oscillation unit, each of the first and second diode loads configured to provide negative resistance at the oscillation frequency,
- wherein the first diode load includes a first transistor, a first resistor coupled between gate and drain terminals of the first transistor, and a first capacitor cross coupled between a drain terminal of the first transistor and a gate terminal of a second transistor of the second diode load,
- wherein the second diode load includes a second transistor, a second resistor coupled between gate and drain terminals of the second transistor, and a second capacitor cross coupled between a grain terminal of the second transistor and a gate terminal of the first transistor,
- wherein the first transistor is coupled in series to the cross-coupled oscillation unit at the first output terminal and the second transistor is coupled in series to the cross-coupled oscillation unit at the second output terminal;
- a reference resonator coupled between the first and second output terminals;
- wherein the cross-coupled oscillation unit further comprises:
  - third and fourth transistors cross-coupled to the first and second output terminals;
  - a third capacitor cross coupled between a drain terminal of the third transistor and a gate terminal of the fourth transistor; and
  - a fourth capacitor cross coupled between a drain terminal of the fourth transistor and a gate terminal of the third transistor; and
- a bias insertion node coupled between the gate terminals of the third and fourth transistors of the cross-coupled oscillation unit.

21. The device of claim 20, further comprising:
- a third resistor coupled between the gate and drain terminals of the third transistor;
- a fourth resistor coupled between the gate and drain terminals of the fourth transistor.

* * * * *